United States Patent
Huangfu et al.

(10) Patent No.: US 9,935,155 B2
(45) Date of Patent: Apr. 3, 2018

(54) PIXEL STRUCTURE, DISPLAY PANEL, AND DISPLAY APPARATUS

(71) Applicant: BOE TECHNOLOGY GROUP CO., LTD, Beijing (CN)

(72) Inventors: Lujiang Huangfu, Beijing (CN); Yinan Liang, Beijing (CN); Tuo Sun, Beijing (CN); Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 15 days.

(21) Appl. No.: 15/031,026

(22) PCT Filed: Dec. 10, 2015

(86) PCT No.: PCT/CN2015/097047
§ 371 (c)(1),
(2) Date: Apr. 21, 2016

(87) PCT Pub. No.: WO2016/169278
PCT Pub. Date: Oct. 27, 2016

(65) Prior Publication Data
US 2017/0104040 A1   Apr. 13, 2017

(30) Foreign Application Priority Data
Apr. 23, 2015  (CN) .......................... 2015 1 0197247

(51) Int. Cl.
*H01L 29/20* (2006.01)
*H01L 27/32* (2006.01)
*G09G 3/20* (2006.01)

(52) U.S. Cl.
CPC ....... *H01L 27/3218* (2013.01); *G09G 3/2003* (2013.01); *G09G 2300/0452* (2013.01); *G09G 2300/0465* (2013.01)

(58) Field of Classification Search
CPC .................................................. H01L 27/3218
(Continued)

(56) References Cited

U.S. PATENT DOCUMENTS

2005/0280727 A1    12/2005  Sato et al.
2011/0291549 A1*   12/2011  Kim ................... H01L 27/3218
                                                    313/504

(Continued)

FOREIGN PATENT DOCUMENTS

CN         103024305 A       4/2013
CN         103366683 A       10/2013
(Continued)

OTHER PUBLICATIONS

The World Intellectual Property Organization (WIPO) International Search Report and Written Opinion and PCT/CN2015/097047 dated Mar. 4, 2016 pp. 1-13.

*Primary Examiner* — Ajay K Arora
(74) *Attorney, Agent, or Firm* — Anova Law Group, PLLC

(57) ABSTRACT

The present disclosure provides a pixel structure, a display panel, and a display apparatus. The pixel structure includes a plurality of pixel cells having a first pixel cell and a first adjacent pixel cell. Each pixel cell includes a first pixel; and two second pixels and two third pixels, surrounding the first pixel. Each of the two second pixels and the two third pixels is arranged separately in a direction along a side of a virtual rectangular area, the first pixel corresponding to one portion of the virtual rectangular area. Each of the two second pixels and the two third pixels has a first portion arranged in the first pixel cell covered by a first virtual rectangular area, and a second portion arranged in the first adjacent pixel cell covered by a second virtual rectangular area.

18 Claims, 8 Drawing Sheets

(58) Field of Classification Search
USPC .......................................................... 257/89
See application file for complete search history.

(56) References Cited

U.S. PATENT DOCUMENTS

| | | | |
|---|---|---|---|
| 2013/0037827 A1* | 2/2013 | Levermore | ......... H01L 27/3202 |
| | | | 257/88 |
| 2014/0252321 A1 | 9/2014 | Pyon et al. | |
| 2015/0015466 A1 | 1/2015 | Feng | |
| 2017/0104040 A1 | 4/2017 | Huangfu et al. | |

FOREIGN PATENT DOCUMENTS

| | | |
|---|---|---|
| CN | 104051493 A | 9/2014 |
| CN | 104766563 A | 7/2015 |
| EP | 2830036 A1 | 1/2015 |

* cited by examiner

PIXEL STRUCTURE, DISPLAY PANEL, AND DISPLAY APPARATUS

CROSS-REFERENCES TO RELATED APPLICATIONS

This application is a national phase entry under 35 U.S.C. § 371 of International Application No. PCT/CN2015/097047, filed on Dec. 10, 2015, which claims priority to Chinese Patent Application CN201510197247.1, filed on Apr. 23, 2015. The above enumerated patent applications are incorporated by reference herein in their entirety.

FIELD OF THE DISCLOSURE

The present disclosure generally relates to the field of display technologies and, more particularly, relates to a pixel structure, a configuring method of the pixel structure, and a display panel including the pixel structure, and a display apparatus including the display panel.

BACKGROUND

A conventional display device is configured with a plurality of pixels. Each pixel includes at least three pixels of different colors. Typically, a pixel includes three pixels in red, green and blue.

The pixel arrangement in the conventional display devices includes array arrangement, mosaic arrangement and Bayer arrangement, as shown in FIGS. 1a-1c. The pixel arrangement is illustrated in accompanying figures with three pixels representing different colors ABC. FIG. 1a shows an array arrangement. Three pixels of ABC colors are alternately arranged in the same row. Pixels in the same column have the same color. FIG. 1b shows a mosaic arrangement. Adjacent pixels in the same row or in the same column are in different colors. Pixels in the same diagonal line are in the same color. FIG. 1c shows a Bayer arrangement. Pixels of two colors are alternately arranged in the same row. Pixels of two colors are alternately arranged in the same column. Pixels in the same diagonal line may be in one or two colors.

To assure image display clarity, high resolution display products require high physical density of pixels, causing process complexity and cost increase in product manufacturing.

Directed to at least alleviate one or more problems set forth above and other problems in the art, the present disclosure provides a pixel structure, a configuring method of the pixel structure, and a display panel including the pixel structure, and a display apparatus including the display panel, to reduce the process complexity and production cost of high resolution displays.

BRIEF SUMMARY OF THE DISCLOSURE

One aspect of the present disclosure provides a pixel structure. The pixel structure includes a plurality of pixel cells having a first pixel cell and a first adjacent pixel cell. Each pixel cell includes a first pixel; and two second pixels and two third pixels, surrounding the first pixel. Each of the two second pixels and the two third pixels is arranged separately in a direction along a side of a virtual rectangular area, the first pixel corresponding to one portion of the virtual rectangular area. Each of the two second pixels and the two third pixels has a first portion arranged in the first pixel cell covered by a first virtual rectangular area, and a second portion arranged in the first adjacent pixel cell covered by a second virtual rectangular area.

Optionally, pixels arranged along adjacent sides of the virtual rectangular area are perpendicular to one another. The virtual rectangular area is centered by the first pixel.

Optionally, the pixels arranged along adjacent sides of the virtual rectangular area are configured in a T-shape, with one pixel having a longitudinal axis aligned with a width center of other pixel.

Optionally, the first pixel has a rectangular shape, and the first pixels in the plurality of pixel cells are uniformly configured.

Optionally, the first pixel has a square shape, and each of the two second pixels and the third pixels has a rectangular shape.

Optionally, the two second pixels and the two third pixels have substantially an equal length, and the equal length is greater than twice a length of the first pixel.

Optionally, the two second pixels and the two third pixels have substantially an equal length, and the equal length is substantially twice a length of the first pixel plus a width of the second pixel or the third pixel.

Optionally, each of the first pixel, the two second pixels, and the two third pixels has a chamfered corner.

Optionally, adjacent second pixel and third pixel are configured in a T-shape. Optionally, same pixels, among the two second pixels and the two third pixels, are configured on opposite sides of the first pixel. Optionally, in each pixel cell: the two second pixels are symmetrically configured and centered by the first pixel, the two third pixels are symmetrically configured and centered by the first pixel, and each of the two third pixels is perpendicular to an adjacent second pixel.

Optionally, the two second pixels are configured in a T-shape, and the two third pixels are configured in a T-shape. Optionally, different pixels, among the two second pixels and the two third pixels, are configured on opposite sides of the first pixel in each pixel cell. Optionally, in each pixel cell: the two second pixels are configured perpendicular to one another, the two third pixels are configured perpendicular to one another, and each of the two third pixels is perpendicular to an adjacent second pixel.

Optionally, each of the two second pixels and the two third pixels further has: a third portion arranged in a second adjacent pixel cell covered by a third virtual rectangular area, and a fourth portion arranged in a pixel cell, adjacent to the first adjacent pixel cell or the second adjacent pixel cell, covered by a fourth virtual rectangular area.

Optionally, each of the first, second, third, and fourth portions includes one quarter of a corresponding second pixel or third pixel.

Optionally, the first pixel, the second pixel and the third pixel are configured to emit different color lights. Optionally, the first pixel is configured to emit green light, the second pixel is configured to emit one of red and blue light, and the third pixel is configured to emit other one of the red and blue light.

Another aspect of the present disclosure provides a display panel. The display panel includes the disclosed pixel structures.

Another aspect of the present disclosure provides a display apparatus. The display apparatus includes the disclosed display panels.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

Figures 1A, 1B, 1C:
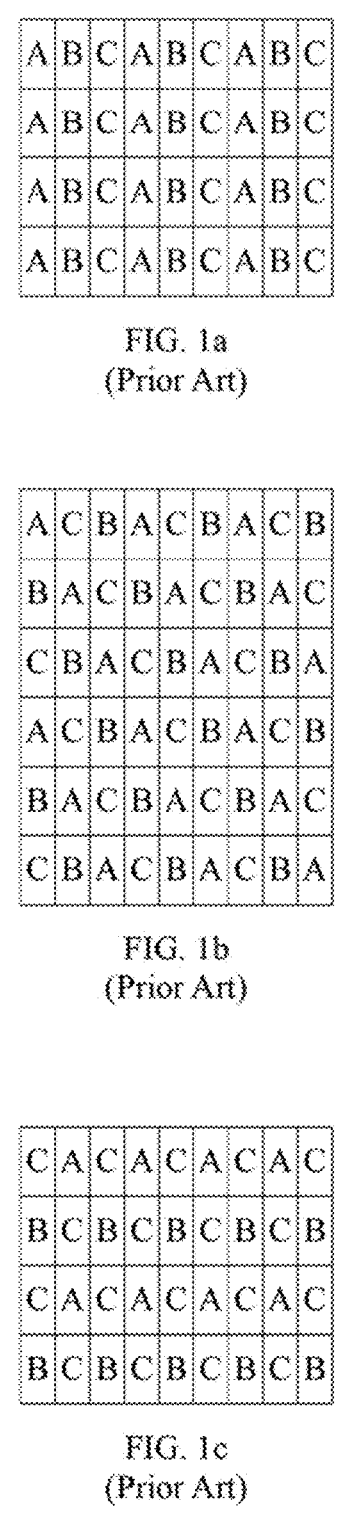

FIGS. 1a-1c illustrate conventional pixel arrangements;

DETAILED DESCRIPTION

Figure 2A:
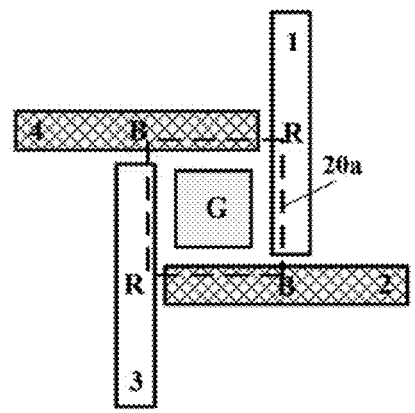
FIGS. 2a-2b illustrate exemplary pixel cells according to various disclosed embodiments.

The introduction of retina display screen for smart phones, along with advancements of other high resolution display technologies, increases resolution of flat panel displays to near or even exceed the resolution limit of human eyes. According to the physiology structure of human eyes, the resolution limit is determined by the density of the human retinal rod photoreceptor cells sensitive to brightness. The human retinal cone photoreceptor cells sensitive to different colors have lower densities than the human retinal rod photoreceptor cells. The cone photoreceptor cells sensitive to short wavelength blue color have the lowest density. The cone photoreceptor cells sensitive to red color have the second lowest density. The brightness effect of blue color and red color for stimulating the rod photoreceptor cells is far less than the brightness effect of green color. As a result, the position resolutions of blue and red pixels by human eyes are greatly lower than the position resolutions of green color pixels and positions of brightness center of the pixel. Under certain physical pixel resolution, human eyes may be able to recognize the position of the pixel brightness center and to distinguish colors, but may be unable to recognize and distinguish the position and boundary of blue or red color pixels at the pixel scale. This provides an opportunity that adjacent blue and/or red color pixels may be shared between adjacent pixels.

Under low resolution displays, due to the fact that human eyes may be able to clearly recognize and distinguish individual pixels, including brightness and color, sharing pixels between different pixels may interfere with the precise image representation by the physical pixels of display panels. Thus, virtual pixel arrangement by sharing pixels may be limited.

The demand for high resolution flat panel displays causes the process complexity and cost increase in production. When the display resolution is comparable with the human eye resolution, the pixel, as normally, simply defined by red, green and blue pixels, may be changed by taking advantages of the differences in pixel resolutions of different colors by human eyes. By sharing certain color pixels that are less sensitive in position resolution between pixels, less number of pixels may be configured to emulate the same pixel resolution. Thus, the process complexity and production cost may be reduced. Based on the above analysis, the present disclosure provides a pixel structure, a configuring method of the pixel structure, and a display panel including the pixel structure, and a display apparatus including the display panel.

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present disclosure and not to limit the present disclosure.

The present disclosure provides a pixel structure. The pixel structure may include pixel cells, for example, that are uniformly configured. Each pixel cell may include a first pixel. The first pixel may be surrounded by two second pixels and two third pixels in the pixel cell. When the pixel cells are arranged as desired, each second pixel may be shared by four adjacent pixel cells and each third pixel may be shared by four adjacent pixel cells. For example, commonly adjacent pixels may be shared in any group including four adjacent pixel cells in the 2×2 arrangement. As a result, a quarter of the second pixel and a quarter of the third pixel may be shared in each pixel cell. Both the second pixel and the third pixel may be shared with the other three adjacent pixel cells.

For example, in the plurality of pixel cells, each of the two second pixels and the two third pixels may have: a first portion arranged in a first pixel cell covered by a first virtual rectangular area; a second portion arranged in a first adjacent pixel cell covered by a second virtual rectangular area; a third portion arranged in a second adjacent pixel cell covered by a third virtual rectangular area, and a fourth portion arranged in a pixel cell, adjacent to the first adjacent pixel cell or the second adjacent pixel cell, covered by a fourth virtual rectangular area. Each of the first, second, third, and fourth portions is a quarter of the corresponding pixel.

In one embodiment, the first pixel may be in the rectangular shape or a square shape. The second and third pixels may also be in the rectangular shape. Preferably, the lengths of the second and third pixels may be equal. Both lengths may each be greater than twice of the length of the first pixel. Alternatively, the lengths of the second and third pixels may be equal. Both lengths may each be substantially equal to twice of length of the first pixel length plus a width of either the second pixel or the third pixel.

Optionally, the first, second and third pixels may have chamfered corners. For example, pixels may be formed in a quadrilateral shape. Sometimes, in an actual production, the quadrilateral shape may not be a complete quadrilateral shape, for example, may not have four complete corners. One or more corners may be chamfered corners. In certain embodiments, the pixel cells each including one first pixel, and two second pixels along with two third pixels surrounding the first pixel, may be arranged as follows. The two second pixels and the two third pixels may be configured along sides of a virtual rectangle. Accordingly, adjacent pixels may be perpendicular to one another, for example, to form a T-shaped structure. The one first pixel may surrounded, e.g., centered, by the two second pixels and two third pixels and be placed within a virtual rectangular area corresponding to the virtual rectangle. In other words, the one first pixel and a portion of each of the two second pixels and the two third pixels are included in the virtual rectangular area.

In certain embodiments, the second and third pixels may be the red and blue pixels respectively, having relatively lower position resolutions recognized by human eyes. The first pixel may be the green pixel, having relatively higher position resolutions recognized by human eyes. The second and third pixels may be interchangeable. For illustration purposes, the present disclosure is primarily described using red pixel as the second pixel, blue pixel as the third pixel, and green pixel as the first pixel, as an example, although any suitable arrangement for the first, second, and third pixels may be used and encompassed in the present disclosure.

In certain embodiments, the two second pixels and the two third pixels may include pixels 1, 2, 3, and 4 arranged as described below to provide a virtual rectangular area. Each of the pixels 1, 2, 3, and 4 may be any one of the two second pixels and the two third pixels.

For example, pixel 1 may be placed in a horizontal or vertical direction. pixel 2 may be placed by overlapping with pixel 1, then using one end of the pixel 1 as a first center to rotate for about 90 degrees clockwise or counterclockwise. The rotated pixel 2 may be moved in a horizontal or vertical direction, such that the pixels 1 and 2 form a substantially T-shaped structure. In some cases, media used to prevent light mixing may be between the two perpendicular sections of the T shape.

The pixel 3 may be placed by first overlapping with the pixel 2, then using one end of the pixel 2, corresponding to the one end of the pixel 1 as the first center, as a second center to rotate for about 90 degrees clockwise or counterclockwise. The rotated pixel 3 may be moved in a horizontal or vertical direction, such that the pixels 2 and 3 form a T-shaped structure.

Likewise, the pixel 4 may be placed by first overlapping with the pixel 3, then using one end of the pixel 3, corresponding to the one end of the pixel 2 as the second center, as a third center to rotate for about 90 degrees clockwise or counterclockwise. The rotated pixel 4 may be moved in a horizontal or vertical direction, such that the pixels 3 and 4 form a T-shaped structure.

In this manner, pixels 2, 3, and 4 may be rotated in a same direction, either clockwise or counterclockwise. The T-shaped structures formed by the pixels 1, 2, 3, and 4 may further overlap with a virtual rectangular area, for example, centered by the first pixel. One first pixel may then be placed within the rectangular area to form a pixel cell.

The above described method of forming a pixel cell may include various embodiments. In a first exemplary embodiment, among the four exemplary pixels 1, 2, 3, 4 of the two second pixels and the two third pixels, any pixels having a same color may be configured in parallel with one another; and any pixels having different colors may be configured perpendicular to one another, as illustrated in FIGS. 2a-2d.

In a second exemplary embodiment, among the four exemplary pixels, any pixels having a same color may be configured perpendicular to one another, and any pixels having different colors may be configured in parallel with one another, as illustrated in FIGS. 3a-3d.

Figure 2B:
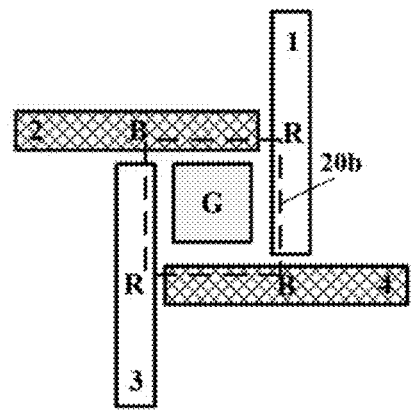
Figure 2C:
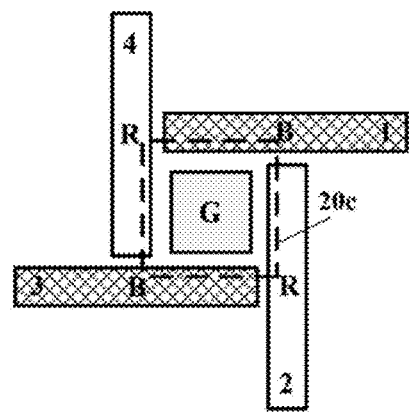
FIGS. 2c-2d illustrate another exemplary pixel cells according to various disclosed embodiments.
Figure 2D:
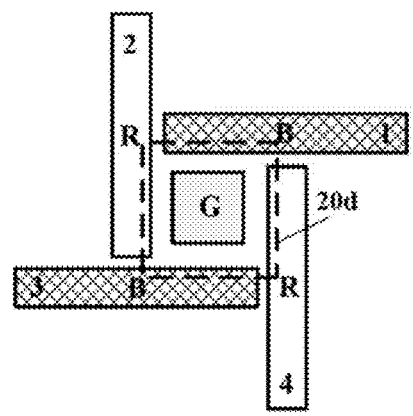

According to the first exemplary embodiment, FIGS. 2a-2b illustrate exemplary pixel cells, and FIGS. 2c-2d illustrate another exemplary pixel cells. Note that the pixel cells respectively illustrated in FIGS. 2a-2b and FIGS. 2c-2d may at least be used to define a position relationship between individual pixels.

As shown in FIG. 2a, the starting pixel is placed vertically. According to the pixel cell formation method, the starting pixel is denoted as the red pixel 1. The next pixel is placed by overlapping with the red pixel 1, rotating by about 90 degrees clockwise using the bottom end of the red pixel 1 as the rotation center, and moving horizontally to the left until forming a T-shaped structure with the red pixel 1. To satisfy the condition that the pixels of the same color are in parallel with one another and the pixels of different colors are perpendicular to one another, the pixel is denoted as the blue pixel 2. The left end of the blue pixel 2 corresponds to the bottom end of the red pixel 1, which is the rotation center. The next pixel is placed by overlapping the blue pixel 2, rotating by about 90 degrees clockwise using the left end of the blue pixel 2 as the rotation center, and moving vertically to the top until forming a T-shaped structure with the blue pixel 2. To satisfy the condition that the pixels of the same color are in parallel with one another and the pixels of different colors are perpendicular to one another, the pixel is denoted as the red pixel 3. The top end of the red pixel 3 corresponds to the left end of the blue pixel 2, which is the rotation center. The next pixel is placed by overlapping the red pixel 3, rotating by 90 degrees clockwise using the top end of the red pixel 3 as the rotation center, and moving horizontally to the right until forming a T-shaped structure with the red pixel 3. To satisfy the condition that the pixels of the same color are in parallel with one another and the pixels of different colors are perpendicular to one another, the pixel is denoted as the blue pixel 4. The right end of the blue pixel 4 corresponds to the top end of the red pixel 3, which is the rotation center.

As shown in FIG. 2b, the starting pixel is placed vertically. According to the pixel cell formation method, the starting pixel is denoted as the red pixel 1. The next pixel is placed by overlapping the red pixel 1, rotating by about 90 degrees counterclockwise using the bottom end of the red pixel 1 as the rotation center, and moving vertically to the top until forming a T-shaped structure with the red pixel 1. To satisfy the condition that the pixels of the same color are in parallel with one another and the pixels of different colors are perpendicular to one another, the pixel is denoted as the blue pixel 2. The right end of the blue pixel 2 corresponds to the bottom end of the red pixel 1, which is the rotation center. The next pixel is placed by overlapping the blue pixel 2, rotating by about 90 degrees counterclockwise using the right end of the blue pixel 2 as the rotation center, and moving horizontally to the left until forming a T-shaped structure with the blue pixel 2. To satisfy the condition that the pixels of the same color are in parallel with one another and the pixels of different colors are perpendicular to one another, the pixel is denoted as the red pixel 3. The top end of the red pixel 3 corresponds to the right end of the blue pixel 2, which is the rotation center. The next pixel is placed by overlapping the red pixel 3, rotating by 90 degrees counterclockwise using the top end of the red pixel 3 as the rotation center, and moving vertically to the bottom until forming a T-shaped structure with the red pixel 3. To satisfy the condition that the pixels of the same color are in parallel with one another and the pixels of different colors are perpendicular to one another, the pixel is denoted as the blue pixel 4. The left end of the blue pixel 4 corresponds to the top end of the red pixel 3, which is the rotation center.

As shown in FIGS. 2a-2b, portions of two red (R) pixels and two blue (B) pixels may define a virtual rectangular area. A green (G) pixel is placed within each virtual rectangular area to form the exemplary pixel cells. FIGS. 2c-2d illustrate additional exemplary pixel cells.

As shown in FIG. 2c, the starting pixel is placed horizontally. According to the pixel cell formation method, the starting pixel is denoted as the blue pixel 1. The next pixel is placed by overlapping the blue pixel 1, rotating by about 90 degrees clockwise using the left end of the blue pixel 1 as the rotation center, and moving horizontally to the right until forming a T-shaped structure with the blue pixel 1. To satisfy the condition that the pixels of the same color are in parallel with one another and the pixels of different colors are perpendicular to one another, the pixel is denoted as the red pixel 2. The top end of the red pixel 2 corresponds to the left end of the blue pixel 1, which is the rotation center. The next pixel is placed by overlapping the red pixel 2, rotating by about 90 degrees clockwise using the top end of the red pixel 2 as the rotation center, and moving vertically to the bottom until forming a T-shaped structure with the red pixel 2.

To satisfy the condition that the pixels of the same color are in parallel with one another and the pixels of different colors are perpendicular to one another, the pixel is denoted as the blue pixel 3. The right end of the blue pixel 3 corresponds to the top end of the red pixel 2, which is the previous rotation center. The next pixel is placed by overlapping the blue pixel 3, rotating by about 90 degrees clockwise using the right end of the blue pixel 3 as the rotation center, and moving horizontally to the left until forming a T-shaped structure with the blue pixel 3. To satisfy the condition that the pixels of the same color are in parallel with one another and the pixels of different colors are perpendicular to one another, the pixel is denoted as the red pixel 4. The bottom end of the red pixel 4 corresponds to the right end of the blue pixel 3, which is the rotation center.

As shown in FIG. 2d, the starting pixel is placed horizontally. According to the pixel cell formation method, the starting pixel is denoted as the blue pixel 1. The next pixel is placed by overlapping the blue pixel 1, rotating by about 90 degrees counterclockwise using the left end of the blue pixel 1 as the rotation center, and moving vertically to the bottom until forming a T-shaped structure with the blue pixel 1. To satisfy the condition that the pixels of the same color are in parallel with one another and the pixels of different colors are perpendicular to one another, the pixel is denoted as the red pixel 2. The bottom end of the red pixel 2 corresponds to the left end of the blue pixel 1, which is the rotation center. The next pixel is placed by overlapping the red pixel 2, rotating by 90 degrees counterclockwise using the bottom end of the red pixel 2 as the rotation center, and moving horizontally to the right until forming a T-shaped structure with the red pixel 2. To satisfy the condition that the pixels of the same color are in parallel with one another and the pixels of different colors are perpendicular to one another, the pixel is denoted as the blue pixel 3. The right end of the blue pixel 3 corresponds to the bottom end of the red pixel 2, which is the rotation center. The next pixel is placed by overlapping the blue pixel 3, rotating by 90 degrees counterclockwise using the right end of the blue pixel 3 as the rotation center, and moving vertically to the top until forming a T-shaped structure with the blue pixel 3. To satisfy the condition that the pixels of the same color are in parallel with one another and the pixels of different colors are perpendicular to one another, the pixel is denoted as the red pixel 4. The top end of the red pixel 4 corresponds to the right end of the blue pixel 3, which is the rotation center.

As shown in FIGS. 2c-2d, two red (R) pixels 3, 4 and two blue (B) pixels 1, 2 are separated from one another. A virtual rectangular area 20a-20d may include at least a portion of each of the separated two red (R) pixels 3, 4 and two blue (B) pixels 1, 2 configured along a side direction of the virtual rectangular area. The green (G) pixel is placed inside each virtual rectangular area to form exemplary pixel cells. In one embodiment, the virtual rectangular area 20a-20d is centered by the exemplary green (G) pixel.

In the second exemplary embodiment as shown in FIGS. 3a-3d, similar pixel cells, compared with the pixel cells shown in FIGS. 2a-2d, may be formed such that pixels of the same color are perpendicular to one another and the pixels of different colors are in parallel with one another.

Figure 3A:
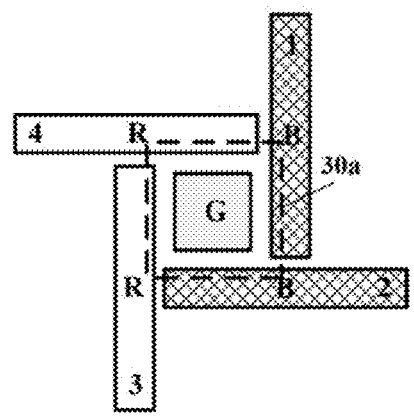
FIGS. 3a-3d illustrate four additional exemplary pixel cells according to various disclosed embodiments.
Figure 3B:
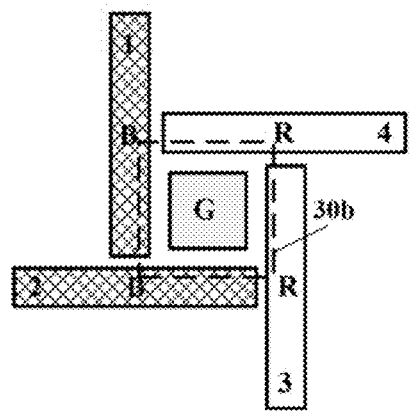
Figure 3C:
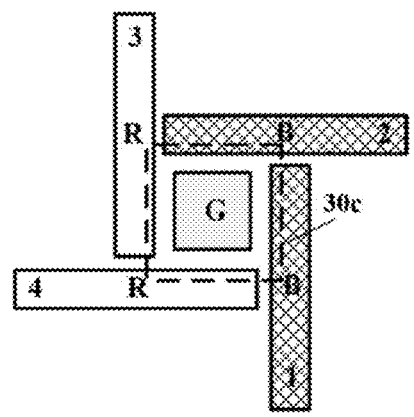
Figure 3D:
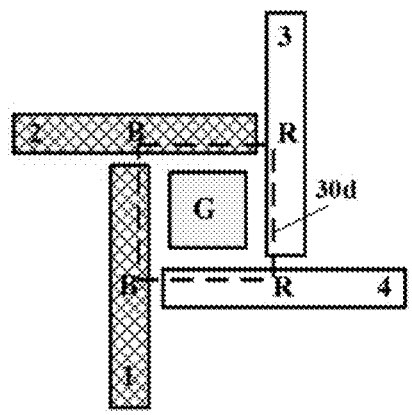
Figures 4, 5:
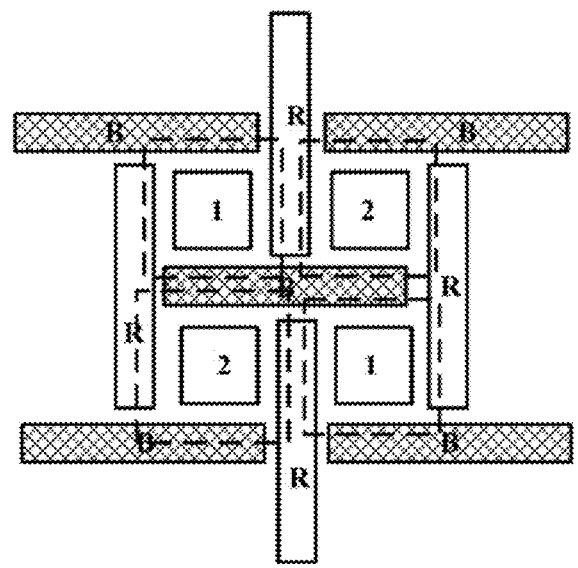
FIG. 4 illustrates an exemplary pixel structure according to various disclosed embodiments.
FIG. 5 illustrates an extended pixel structure based on the exemplary pixel structure in FIG. 4 according to various disclosed embodiments.

In addition, as shown in FIGS. 3c-3d, two red (R) pixels 3, 4 and two blue (B) pixels 1, 2 are separated from one another. A virtual rectangular area 30a-30d may be defined to include at least a portion of each of the separated two red (R) pixels 3, 4 and two blue (B) pixels 1, 2 configured along a side direction of the virtual rectangular area. The green (G) pixel is placed inside each virtual rectangular area to form exemplary pixel cells. In one embodiment, the exemplary green (G) pixel is configured in the center of each of the virtual rectangular areas 30a-30d. FIG. 4 illustrates an exemplary pixel structure including exemplary pixel cells as shown in FIGS. 2a-2d. Two second pixels are symmetrically arranged with respect to the center of each first pixel. Similarly, two third pixels are symmetrically arranged with respect to the center of each first pixel. The third pixels are perpendicular to each of the adjacent second pixels.

Specifically, the pixel structure may include the pixel cells shown in FIGS. 2a-2d. The pixel cells shown in FIGS. 2a-2b are labeled as type 1 pixel cells in FIG. 4 and the pixel cells shown in FIGS. 2c-2d are labeled as type 2 pixel cells in FIG. 4. The type 1 and type 2 pixel cells are symmetrically configured in the vertical direction.

Although FIG. 4 shows four pixel cells for illustration purposes, more or less than four pixel cells, selected from type 1 pixel cells as illustrated in FIGS. 2a-2b and type 2 pixel cells as illustrated in FIGS. 2c-2d, may be included in the pixel structure in the present disclosure. The pixel structure in FIG. 4 may include two type 1 pixel cells and two type 2 pixel cells. In certain embodiments, the number of pixel cells of each type may be determined by the required dimensions of the display panel.

FIG. 5 illustrates an extended pixel structure according to FIG. 4. The type 1 and type 2 pixel cells are replicated alternately in the horizontal direction and in the vertical direction. In other words, the type 1 and type 2 pixel cells appear alternately in the horizontal direction and in the vertical direction. Among the exemplary four pixel cells shown in FIGS. 4-5, adjacent pixel cells may share adjacent pixels to provide pixel structure in FIGS. 4-5.

Figure 6:
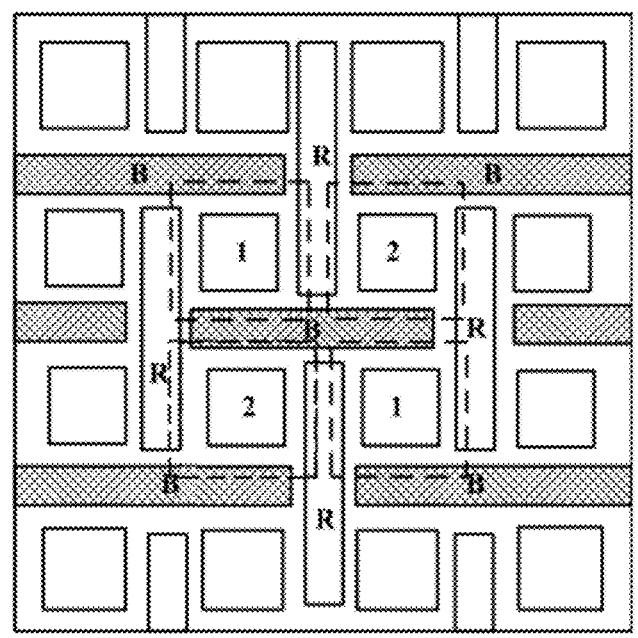
FIG. 6 illustrates a display area with pixel cells arranged based on the exemplary pixel structure in FIG. 4 according to various disclosed embodiments.

FIG. 6 illustrates a display area with pixel structures arranged according to FIG. 4. As shown in FIG. 6, commonly adjacent pixels are shared in any group including four adjacent pixel cells in the 2×2 arrangement, including two type 1 pixel cells and two type 2 pixel cells. It should be noted that pixels in the peripheral may be independently arranged and may not be shared.

Figure 7:
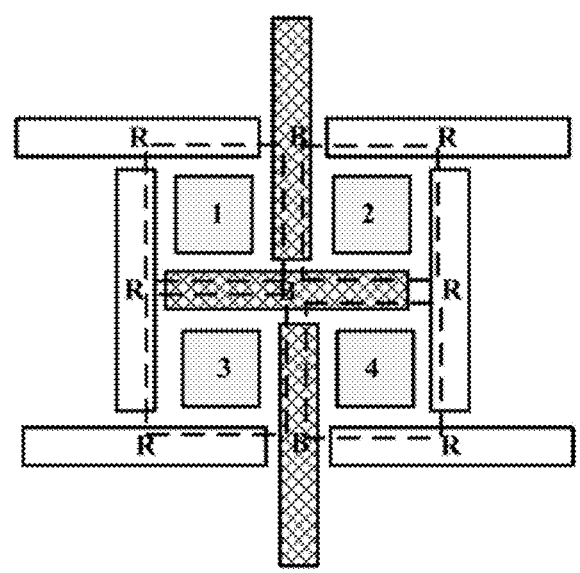
FIG. 7 illustrates another exemplary pixel structure according to various disclosed embodiments.

FIG. 7 illustrates another exemplary pixel structure with pixel cells as illustrated in FIGS. 3a-3d. Two adjacent second pixels are perpendicular to one another. Two adjacent third pixels are perpendicular to one another. Each second pixel is perpendicular to an adjacent third pixel.

Specifically, the pixel structure may include the pixel cells illustrated in FIGS. 3a-3d. The pixel cell as shown in FIG.

3*a* is labeled as type 1 pixel cell in FIG. 7. The pixel cell as shown in FIG. 3*b* is labeled as type 2 pixel cell in FIG. 7. The pixel cell as shown in FIG. 3*c* is labeled as type 3 pixel cell in FIG. 7. The pixel cell as shown in FIG. 3*d* is labeled as type 4 pixel cell in FIG. 7. The type 1 and type 2 pixel cells are symmetrically configured in the vertical direction. The type 1 and type 3 pixel cells are symmetrically configured in the horizontal direction. The type 2 and type 4 pixel cells are symmetrically configured in the horizontal direction. The type 3 and type 4 pixel cells are symmetrically configured in the vertical direction. Although FIG. 7 shows four pixel cells for illustration purposes, more or less than four pixel cells, selected from type 1 pixel cell as illustrated in FIG. 3*a*, type 2 pixel cell as illustrated in FIG. 3*b*, type 3 pixel cell as illustrated in FIG. 3*c*, and type 4 pixel cell as illustrated in FIG. 3*d*, may be included in the pixel structure in the present disclosure. In certain embodiments, the number of pixel cells of each type may be determined by the required dimensions of the display panel.

Figures 8, 9:
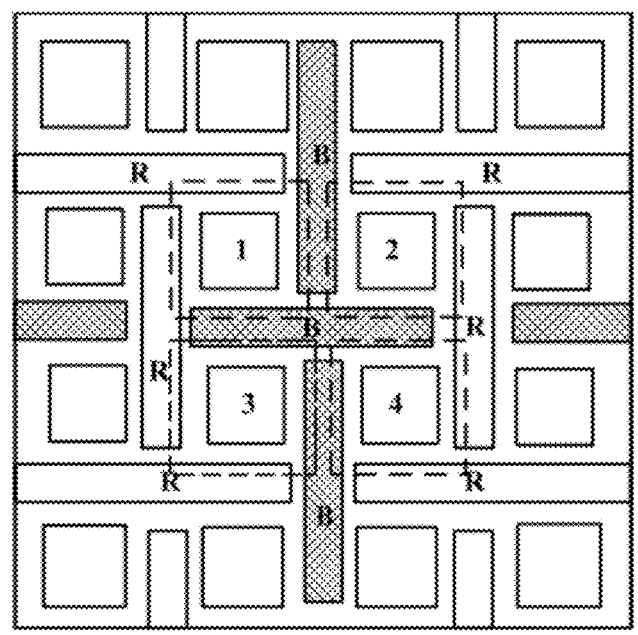
FIG. 8 illustrates an extended pixel structure based on the exemplary pixel structure in FIG. 7 according to various disclosed embodiments.
FIG. 9 illustrates a display area with pixel cells arranged based on the exemplary pixel structure in FIG. 7 according to various disclosed embodiments.

FIG. 8 illustrates an extended pixel structure according to FIG. 7. Each exemplary pixel structure in FIG. 7 may include the four types of pixel cells in FIGS. 3*a*-3*d*. The type 1, type 2, type 3 and type 4 pixel cells are replicated alternately in the horizontal direction and in the vertical direction. In other words, the type 1, type 2, type 3 and type 4 pixel cells appear alternately in the horizontal direction and in the vertical direction. Among the exemplary four pixel cells shown in FIGS. 7-8, adjacent pixel cells may share adjacent pixels to provide the exemplary pixel structures in FIGS. 7-8.

FIG. 9 illustrates a display area with pixel structures arranged according to FIG. 7. As shown in FIG. 9, commonly adjacent pixels are shared in any group including four adjacent pixel cells shown in FIGS. 3*a*-3*d* in the exemplary 2×2 arrangement. It should be noted that pixels in the peripheral may be independently arranged and may not be shared. In various embodiments, individual pixels may be separated by a predetermined distance.

In a display area including the disclosed pixel cells and pixel structures, the number of green (G) pixels may be equal to the number of pixel cells. The number of red (R) pixels and the number of blue (B) pixels may be the same, which is equal to a half of the number of pixel cells. On average, each pixel cell in a pixel structure may include one first pixel, one quarter of the two second pixels, and one quarter of the two third pixels.

By sharing pixels among pixel cells, the present disclosure reduces the number of pixels required for each pixel cell, and reduces the physical density of pixels while the pixel resolution of image display remains the same. Thus, the process complexity and production cost are reduced and the production yield is increased, for example, for producing high resolution display products such as thin film transistor liquid crystal display (TFT LCD) and active-matrix organic light-emitting diode (AMOLD) displays.

The present disclosure also provides a display panel. The display panel may include pixel cells in FIGS. 2*a*-2*d* and FIGS. 3*a*-3*d* arranged according to the disclosed methods. The detail description will not be duplicated herein.

The disclosed display panel may include a TFT LCD or an OLED display panel, or any other suitable display panel. For example, a TFT LCD display panel may include an array substrate and a color filter substrate. An OLED display panel may include an array substrate.

The present disclosure also provides a display apparatus. The display apparatus may include a disclosed display panel. For example, the disclosed display apparatus may be a color liquid crystal display (LCD) display apparatus, an organic light-emitting diode (OLED) display apparatus, a cathode ray tube (CRT) display apparatus, a plasma apparatus, an electronic paper display apparatus, an AMOLED display apparatus, or any suitable display apparatus, without limitation.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A pixel structure, comprising:
a first pixel; and
side pixels including two second pixels and two third pixels, wherein:
one side of each side pixel is substantially parallel to at least one side of another side pixel;
the side pixels surround the first pixel and a virtual rectangular area containing at least a portion of the first pixel is defined;
at least two adjacent ones of the side pixels are approximately perpendicular to each other and together form a T-shaped pattern; and
a portion of at least one of the side pixels extends outside the virtual rectangular area.

2. The pixel structure of claim 1, wherein:
the virtual rectangular area is centered by the first pixel.

3. The pixel structure of claim 2, wherein:
the T-shaped pattern is formed with one pixel having a longitudinal axis aligned with a width center of another pixel.

4. The pixel structure of claim 1, wherein:
the first pixel has a rectangular shape, and
a plurality of the first pixels in a plurality of the pixel structures are arrayed.

5. The pixel structure of claim 1, wherein:
the first pixel has a square shape, and
each of the side pixels has a rectangular shape.

6. The pixel structure of claim 5, wherein:
the side pixels have substantially equal length, and
the equal length is greater than twice a length of the first pixel.

7. The pixel structure of claim 5, wherein:
the side pixels have substantially equal length, and
the equal length is substantially twice a length of the first pixel plus a width of the second pixel or the third pixel.

8. The pixel structure of claim 5, wherein the first pixel and each of the side pixels have at least one chamfered corner.

9. The pixel structure of claim 5, wherein same pixels, among the two second pixels and the two third pixels, are configured on opposite sides of the first pixel.

10. The pixel structure of claim 9, wherein:
the two second pixels are symmetrically configured and centered by the first pixel,
the two third pixels are symmetrically configured and centered by the first pixel, and
each of the two third pixels is approximately perpendicular to an adjacent second pixel.

11. The pixel structure of claim 5, wherein:
the two second pixels are configured in a T-shaped pattern, and
the two third pixels are configured in another T-shaped pattern.

12. The pixel structure of claim 11, wherein different pixels, among the two second pixels and the two third pixels, are configured on opposite sides of the first pixel.

13. The pixel structure of claim 11, wherein:
the two second pixels are configured approximately perpendicular to one another,
the two third pixels are configured approximately perpendicular to one another, and
each of the two third pixels is approximately perpendicular to an adjacent second pixel.

14. The pixel structure of claim 1, wherein: the first pixel, the second pixel, and the third pixel are configured to emit different color lights.

15. The pixel structure of claim 14, wherein:
the first pixel is configured to emit green light,
the second pixel is configured to emit one of red or blue light, and
the third pixel is configured to emit the other one of the red or blue light not emitted by the second pixel.

16. A display panel, comprising the pixel structure of claim 1.

17. A display apparatus, comprising the display panel of claim 16.

18. The pixel structure of claim 1, wherein: a portion of the side pixels covered by the virtual rectangular area is one quarter of an area of the side pixels.

\* \* \* \* \*